(12) United States Patent
Tailliet

(10) Patent No.: US 10,903,209 B2
(45) Date of Patent: Jan. 26, 2021

(54) MOS TRANSISTORS IN PARALLEL

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 38 days.

(21) Appl. No.: 16/053,304

(22) Filed: Aug. 2, 2018

(65) Prior Publication Data

US 2019/0057963 A1 Feb. 21, 2019

(30) Foreign Application Priority Data

Aug. 16, 2017 (FR) ...................................... 17 57700

(51) Int. Cl.
| | |
|---|---|
| *H01L 21/762* | (2006.01) |
| *H01L 21/8234* | (2006.01) |
| *H01L 29/10* | (2006.01) |
| *H01L 27/088* | (2006.01) |
| *H01L 29/06* | (2006.01) |
| *H01L 29/78* | (2006.01) |

(52) U.S. Cl.
CPC ...... *H01L 27/088* (2013.01); *H01L 21/76224* (2013.01); *H01L 21/76229* (2013.01); *H01L 21/823481* (2013.01); *H01L 29/0649* (2013.01); *H01L 29/1037* (2013.01); *H01L 29/78* (2013.01); *H01L 21/823412* (2013.01)

(58) Field of Classification Search
CPC .................................................... H01L 27/088
See application file for complete search history.

(56) References Cited

U.S. PATENT DOCUMENTS

| | | | |
|---|---|---|---|
| 4,379,305 A | 4/1983 | Mitchell | |
| 5,473,186 A * | 12/1995 | Morita | .............. H01L 21/76229 257/519 |
| 2001/0005022 A1* | 6/2001 | Ogura | ............... H01L 29/66439 257/103 |
| 2007/0111409 A1 | 5/2007 | Watanabe et al. | |
| 2009/0203188 A1 | 8/2009 | Shin et al. | |
| 2011/0081782 A1 | 4/2011 | Liang et al. | |
| 2011/0169125 A1* | 7/2011 | Reinmuth | ........... H01L 21/3081 257/506 |
| 2013/0181297 A1 | 7/2013 | Liaw | |

FOREIGN PATENT DOCUMENTS

JP 2002-118253 A 4/2002

* cited by examiner

*Primary Examiner* — William A Harriston
(74) *Attorney, Agent, or Firm* — Seed Intellectual Property Law Group LLP

(57) ABSTRACT

An electronic chip is provided that includes a plurality of first transistors electrically coupled to one another in parallel. A plurality of first isolating trenches is included in the electronic chip, and the first transistors are separated from one another by the first isolating trenches. Each of the first isolation trenches has a depth and a maximum width, and the depth depends on, or is a function of, the maximum width.

19 Claims, 2 Drawing Sheets

MOS TRANSISTORS IN PARALLEL

This application claims the priority benefit of French patent application number 17/57700, filed on Aug. 16, 2017, the content of which is hereby incorporated by reference in its entirety to the maximum extent allowable by law.

BACKGROUND

Technical Field

The present disclosure generally relates to electronic circuits, and more particularly to integrated circuits containing transistors formed of a plurality of transistors connected in parallel.

Description of the Related Art

Isolating trenches, and more particularly STI (Shallow Trench Isolation) trenches or shallow trenches are currently used in integrated circuits to separate and isolate transistors from one another.

The dimensions of a trench, and more particularly its maximum width, that is, the trench width at the level of the substrate surface where the trench is formed, and its depth, are selected according to the potential difference that the trench should be able to isolate between its two sides. It is possible to determine, for example, empirically, the smallest dimensions from which the trench isolates two transistors, for a given context of use. Thus, an integrated circuit designer selects design rules setting the dimensions that the trenches separating transistors of a given integrated circuit should have. Trenches having dimensions smaller than the dimensions set by the design rules do not provide a correct isolation and leakage currents appear between neighboring transistors.

BRIEF SUMMARY

One or more embodiments provided herein overcome all or part of the disadvantages of usual integrated circuits comprising a plurality of transistors in parallel.

One or more embodiments provide an electronic chip comprising a plurality of first transistors electrically coupled to one another in parallel. A plurality of first isolating trenches is included, and the first transistors are separated from one another by the first isolating trenches. Each of the first isolation trenches has a depth and a maximum width, and the depth depends on the maximum width.

According to an embodiment, the gates of the first transistors are interconnected, the drain areas of the first transistors are interconnected, and the source areas of the first transistors are interconnected.

According to an embodiment, the electronic chip includes a second transistor, and a second isolating trench. The second transistor is separated from the plurality of first transistors by the second isolating trench. The second isolating trench has a depth and a maximum width, and the depth of the second isolating trench is independent of the maximum width of the second isolating trench.

According to an embodiment, the electronic chip comprises a plurality of second transistors and a plurality of second isolating trenches. The second transistors are separated from one another and from the plurality of first transistors by the second isolating trenches. Each of the second isolating trenches has a depth and a maximum width, and the depth of the second isolating trenches is independent of the maximum width.

According to an embodiment, the depth of the first trenches is smaller than the depth of the second trenches.

According to an embodiment, the depth of the first trenches is greater than half the depth of the second trenches.

According to an embodiment, the second transistors are not connected in parallel.

According to an embodiment, the maximum width of the second isolating trenches is a function of a degree of electrical isolation desired between the second transistors.

According to an embodiment, the first and the second transistors have a substantially same channel width.

According to an embodiment, the maximum width of the first trenches is smaller than half of the smallest maximum width of the second trenches.

According to an embodiment, the width of the channels of the first transistors is a function of a desired threshold voltage of the first transistors.

According to an embodiment, the first isolating trenches have a triangular cross-section.

According to an embodiment, the electronic chip comprises a plurality of transistors formed of first transistors.

An embodiment provides an electronic circuit comprising a chip such as described hereabove.

In one or more embodiments, a device is provided that includes a substrate having a surface and a first equivalent transistor. The first equivalent transistor includes a plurality of first transistors and a plurality of first isolation trenches positioned between adjacent ones of the first transistors. Each of the first transistors includes a channel extending into the substrate from the surface and having a first width, a source, a drain, and a gate. The gates of the first transistors are electrically coupled to one another, the sources of the first transistors are electrically coupled to one another, and the drains of the first transistors are electrically coupled to one another. The device further includes a second transistor and a second isolation trench positioned between the second transistor and the plurality of first transistors. The second isolation trench has a second width that is greater than a first width of each of the first isolation trenches.

According to an embodiment, the second transistor has a channel width that is substantially the same as the channel width of the first transistors.

According to an embodiment, the first isolation trenches extend into the substrate from the surface to a first depth, the second isolation trench extends into the substrate from the first surface to a second depth, and the second depth is greater than the first depth.

According to an embodiment, the first isolation trenches have a triangular cross-sectional shape, and the second isolation trench has an isosceles trapezoidal cross-sectional shape.

The foregoing and other features and advantages will be discussed in detail in the following non-limiting description of specific embodiments in connection with the accompanying drawings.

DETAILED DESCRIPTION

Figure 1:
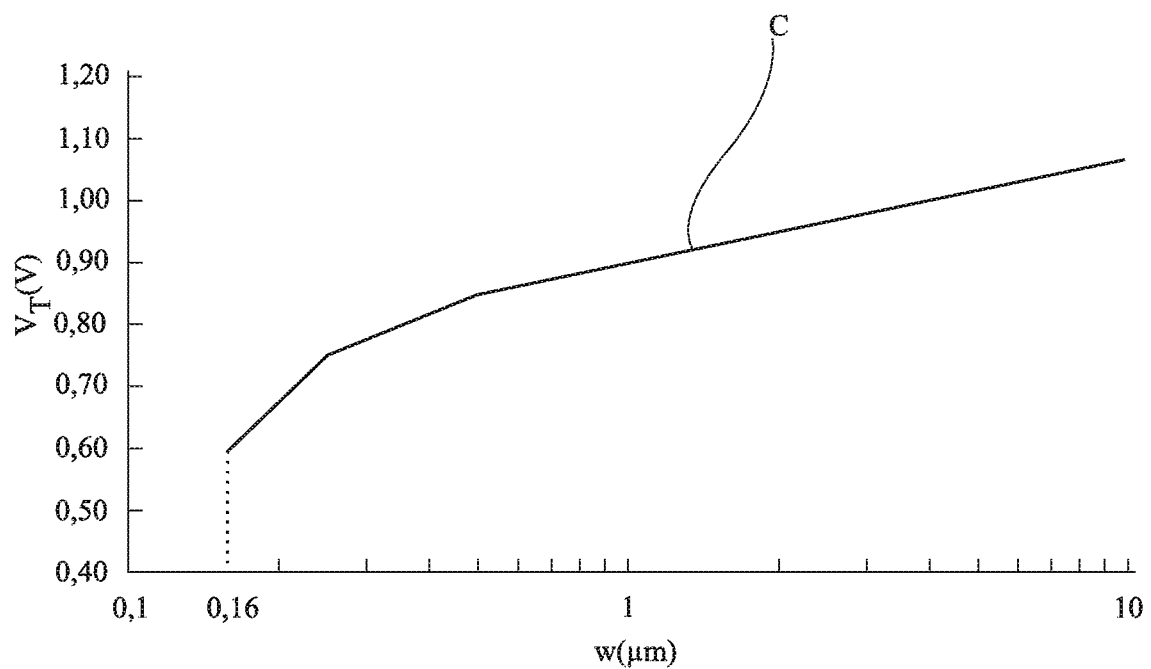
FIG. 1 is a graph showing an example of the shape of the threshold voltage of a reverse narrow channel effect transistor according to the channel width of the transistor.

The same elements have been designated with the same reference numerals in the various drawings and, further, the various drawings are not to scale. For clarity, only those steps and elements which are useful to the understanding of the described embodiments have been shown and are detailed. In particular, the source and drain areas of the transistors are neither described, nor shown.

In the following description, when reference is made to terms qualifying the relative position, such as term "lower", "upper", etc., reference is made to the orientation of the concerned elements in the drawings.

Unless otherwise specified, term "approximately" means to within 10%, preferably to within 5%.

According to the technology and more particularly to the form of the isolation oxide between MOS transistors and the isolation type, the threshold voltage of the transistors varies in direct fashion (so-called "narrow channel effect" transistors) or in reverse fashion (so-called "reverse narrow channel effect" transistors) with the channel width. The present disclosure more particularly is directed to reverse narrow channel effect transistors, although embodiments provided herein are not limited thereto.

FIG. 1 shows a curve C illustrating the variations of the threshold voltage $V_T$, in Volts (V), of a reverse narrow channel effect transistor, according to the channel width W, in μm, of this transistor.

Curve C more specifically illustrates the variations of the threshold voltage of an N-type MOS transistor having a gate length, in this example, equal to 0.66 μm. The observations made from this example are however valid for all types of reverse narrow channel effect MOS transistors.

Curve C shows that the value of threshold voltage $V_T$ of the transistor decreases when the value of the channel width W of this transistor is decreased. In the considered example, the threshold voltage decreases from 1.05 V, for a 10-μm channel width, to 0.6 V for a 0.16-μm channel width. This is caused by the reverse narrow channel effect: the smaller the channel width, the stronger the influence of the channel edges and the lower the threshold voltage.

However, the channel width of a transistor conditions the maximum current that the transistor can conduct. To increase the current that can be circulated through a transistor, the channel width thereof can be increased. However, its threshold voltage is also increased. A solution is to connect in parallel a plurality of transistors having a lower threshold voltage.

Figure 2:
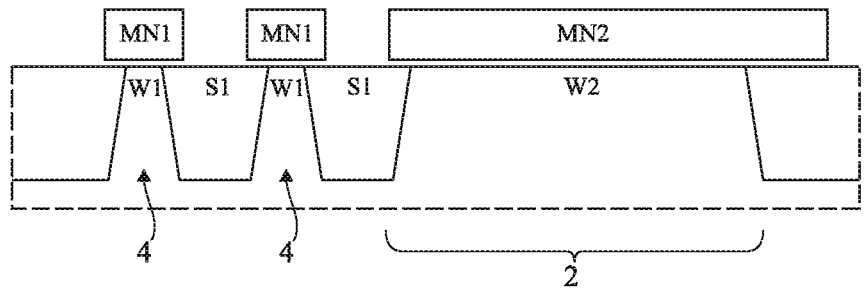
FIG. 2 is a cross-section view schematically showing two transistors of a first type and one transistor of a second type.

FIG. 2 is a cross-section view schematically illustrating two transistors 4 of a first type and one transistor 2 of a second type. The transistors 4 of the first type are characterized by a relatively small channel width and a relatively low threshold voltage due to the reverse narrow channel effect. The transistors of the second type are transistors capable of conducting a current greater than the current capable of flowing through the transistors of the first type and are characterized by larger channel width than that of the transistors of the first type. Due to their channel width, the transistors of the second type have a higher threshold voltage than the transistors of the first type.

In the example of FIG. 2, each transistor 4 comprises a channel having relatively low width W1, drain and source areas, not shown, and a gate MN1. Transistors 4 are isolated from each other and from transistor 2 by trenches S1.

Transistor 2 is a transistor having a channel of relatively large width W2 (as compared with width W1), drain and source areas, not shown, and a gate MN2.

Isolating trenches S1 for example have, in widthwise cross-section, a trapezoidal shape, for example, the shape of an isosceles trapezoid. The upper and lower portions of each trench, that is, the area at the surface of the substrate having the trench formed therein, and the bottom of the trench, are parallel. Further, the lateral walls of all the trenches have the same slope, determined by the manufacturing process. Isolating trenches S1 have a similar depth whatever their width. This depth is determined by the manufacturing process or technology.

Figure 3:
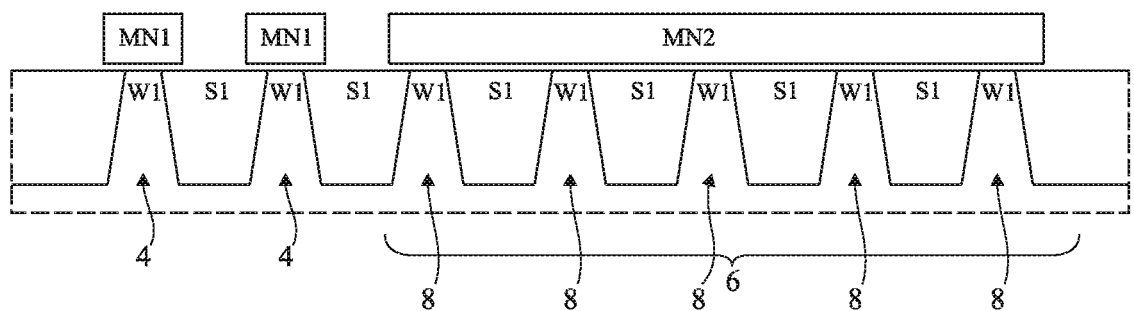
FIG. 3 is a cross-section view schematically showing a transistor formed of transistors connected in parallel associated with two transistors of the first type.

FIG. 3 is a simplified cross-section view of two transistors 4 of the first type and of a transistor 6 equivalent to transistor 2 of FIG. 2. Transistors 4 of FIG. 3 are the same as those of FIG. 2 and will not be described again.

Transistor 6 is formed of a plurality, here five, of elementary transistors 8, connected in parallel. All transistors 8 have a common gate MN2.

When it is here spoken of transistors connected in parallel, transistors having interconnected gates, interconnected source areas, and interconnected drain areas are considered.

Transistors 8 are transistors similar to transistors 4, that is, of same channel width and separated from one another by isolating trenches S1 having a maximum width equal to the maximum width of isolating trenches S1 separating transistors 4. Transistors 8, and thus transistor 6, have the same threshold voltage as transistors 4.

Such a structure is however surface consuming. Indeed, integrated circuit designers use up to now a same design rule for all isolating trenches.

Figure 4:
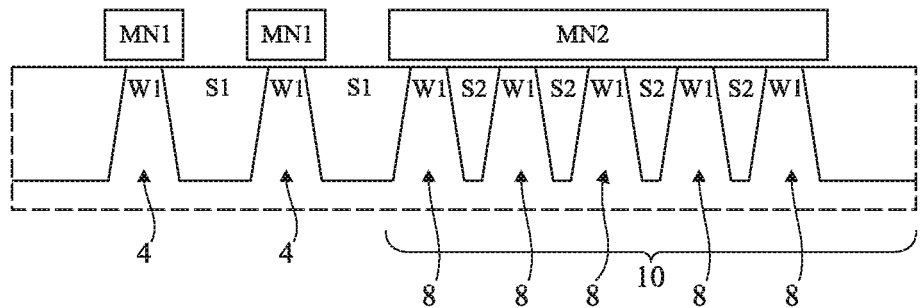
FIG. 4 is a cross-section view schematically showing an embodiment of a transistor formed of transistors in parallel.
Figure 5:
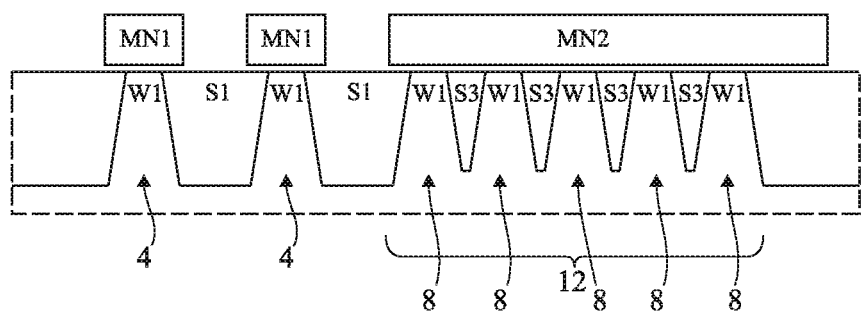
FIG. 5 is a cross-section view schematically showing another embodiment of a transistor formed of transistors in parallel.

FIGS. 4 and 5 are cross-section views schematically illustrating embodiments of a transistor equivalent to a transistor of the second type and comprising transistors 8 of the first type connected in parallel. FIGS. 4 and 5 further show the two transistors 4 such as they have been previously described.

In the embodiments of FIGS. 4 and 5, transistors 8 are connected in parallel, and have a common gate MN2. All source areas are at a same potential and all drain areas are at a same potential. There thus is not potential difference to be withstood by the trenches located between transistors 8 connected in parallel and the leakage current problem is not posed. It is thus possible to decrease the width of the trenches separating transistors 8.

Such a decrease is not used for trenches separating transistors which are not connected in parallel. Indeed, they would not enable to properly isolate neighboring transistors and would cause leakage currents.

Thus, the trenches separating transistors 8 do not have the function of electrically isolating the transistors from one another, but only of separating them and of causing the reverse narrow channel effects enabling to decrease the threshold voltage.

FIG. 4 shows an embodiment of a transistor 10 formed of a plurality of transistors 8 (here five) connected in parallel. The channels of transistors 8 are separated from one another by isolating trenches S2. More particularly, trenches S2 have a maximum width smaller than that of the isolating trenches S1 used between transistors 4 and between transistor(s) 4 and transistor(s) 10. Trenches S2 may have a maximum width smaller than the widths of all the other isolating trenches of the chip. Trenches S2 for example have a width smaller than half the smallest width of trenches S1. Trenches S2 have a shape similar to that of trenches S1, that is, in widthwise cross-section, a trapezoidal shape, for example, the shape of an isosceles trapezoid. Trenches S2 have, in FIG. 4, a depth similar to that of trenches S1 and independent from their width. Trenches S2 comprises a bottom parallel to the area at the surface of the substrate.

FIG. 5 shows another embodiment of a transistor 12 comprising transistors 8 (here, five) connected in parallel and separated by isolating trenches S3.

The maximum width of trenches S3 is smaller than that of trenches S2 (FIG. 4). The maximum width of trenches S3 is sufficiently small for the bottoms of trenches S3 not to be parallel to the surface of the substrate, and for the trench to have the shape of a triangle. Indeed, the slope of the lateral walls of all isolating trenches being constant for a same manufacturing process, there thus exists a value of the maximum trench width from which the lateral walls of a trench intersect at a depth smaller than the depth of trenches S1 or S2.

Trenches S3 for example have a depth in the range from the depth of trenches S1 to approximately half the depth of trenches S1.

Thus, whatever the embodiment, it can be considered that the maximum width (in practice, the width at the surface) of the isolating trenches separating the active areas (channels) of the transistors is, for the transistors connected in parallel (trenches S2 and S3), smaller than that of the other transistors (trenches S1). Further, the depth of trenches S2 or S3 has no influence upon the threshold voltage of the transistor.

The above-described embodiments enable to form MOS transistors formed of a plurality of elementary transistors connected in parallel, having a small threshold voltage and a decreased surface with respect to transistors such as that shown in FIG. 3, taking advantage of the fact that, for transistors in parallel, one need not be concerned about the leakage current between transistors.

Specific embodiments have been described. Various alterations, modifications, and improvements will occur to those skilled in the art. In particular, transistors 10 and 12 have been described as being formed of five elementary transistors 8. The number of elementary transistors may however be different, to form a transistor 10 or 12 having the desired characteristics.

Further, the number of transistors of the first and second types as well as the number of transistors formed by transistors in parallel may be greater than the number of such transistors shown in the drawings.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electronic chip, comprising:
   a plurality of first transistors electrically coupled to one another in parallel;
   a plurality of first isolating trenches, the first transistors being separated from one another by the first isolating trenches, each of the first isolating trenches having a depth and a maximum width, wherein the depth of the first isolating trenches is a function of the maximum width;
   a second isolating trench adjacent to the plurality of first transistors, the second isolating trench having a depth that is greater than the depth of the first isolating trenches and a maximum width that is greater than the maximum width of the first isolating trenches; and
   a plurality of second transistors electrically coupled to one another in parallel, wherein the first transistors together form a first equivalent transistor, and the second transistors together form a second equivalent transistor.

2. The electronic chip of claim 1, wherein each of the first transistors includes a gate, a source area, and a drain area, the gates of the plurality of first transistors being coupled to one another, the drain areas of the plurality of first transistors being coupled to one another, and the source areas of the plurality of first transistors being coupled to one another.

3. The electronic chip of claim 1,
   wherein the plurality of second transistors is separated from the plurality of first transistors by the second isolating trench, and wherein the depth of the second isolating trench is independent of the maximum width of the second isolating trench.

4. The electronic chip of claim 1, wherein a channel width of the first transistors is a function of a threshold voltage of the first transistors.

5. The electronic chip of claim 1, wherein the first isolating trenches have a triangular cross-section.

6. The electronic chip of claim 1 wherein the first isolating trenches have the maximum width at upper surfaces of the first isolating trenches, the first isolating trenches having widths which gradually narrow from the upper surfaces toward the depth of the first isolation trenches.

7. An electronic chip, comprising:
   a plurality of first transistors electrically coupled to one another in parallel;
   a plurality of first isolating trenches, the first transistors being separated from one another by the first isolating trenches, each of the first isolating trenches having a depth and a maximum width, wherein the depth of the first isolating trenches is a function of the maximum width;
   a plurality of second transistors; and
   a plurality of second isolating trenches, the plurality of second transistors being separated from one another and from the plurality of first transistors by the second isolating trenches, each of the second isolating trenches having a depth and a maximum width, wherein the depth of the second isolating trenches is independent of the maximum width of the second isolating trenches.

8. The electronic chip of claim 7, wherein the depth of the first trenches is smaller than the depth of the second trenches.

9. The electronic chip of claim 7, wherein the depth of the first trenches is greater than half the depth of the second trenches.

10. The electronic chip of claim 7, wherein the depth of the first trenches is less than the depth of the second trenches and greater than half of the depth of the second trenches.

11. The electronic chip of claim 7, wherein the second transistors are not coupled to one another in parallel.

12. The electronic chip of claim 7, wherein the maximum width of the second isolating trenches is a function of a degree of electrical isolation between the second transistors.

13. The electronic chip of claim 7, wherein the first and the second transistors have a substantially same channel width.

14. The electronic chip of claim 7, wherein the maximum width of the first trenches is smaller than half of the smallest maximum width of the second trenches.

15. An electronic circuit, comprising:
an electronic chip, including:
a plurality of first transistors electrically coupled to one another in parallel;
a plurality of first isolating trenches, the first transistors being separated from one another by the first isolating trenches, each of the first isolating trenches having a depth and a maximum width, wherein the depth is a function of the maximum width; and
a second isolating trench adjacent to the plurality of first transistors, the second isolating trench having a depth that is greater than the depth of the first isolating trenches and a maximum width that is greater than the maximum width of the first isolating trenches; and
a second plurality of first transistors electrically coupled to one another in parallel, wherein the first transistors together form a first equivalent transistor, and the second plurality of first transistors together form a second equivalent transistor.

16. The electronic circuit of claim 15 wherein:
wherein the second plurality of first transistors is separated from the plurality of first transistors by the second isolating trench, and wherein the depth of the second isolating trench is independent of the width of the second isolating trench.

17. A device, comprising:
a substrate having a surface;
a first equivalent transistor, including:
a plurality of first transistors, each of the first transistors including a channel extending into the substrate from the surface and having a first width, a source, a drain, and a gate, the gates of the first transistors being electrically coupled to one another, the sources of the first transistors being electrically coupled to one another, and the drains of the first transistors being electrically coupled to one another; and
a plurality of first isolation trenches positioned between adjacent ones of the first transistors, each of the first isolation trenches having a first width;
a plurality of second transistors, the second transistors having a channel width that is substantially the same as the channel width of the first transistors; and
a second isolation trench positioned between the plurality of second transistors and the plurality of first transistors, the second isolation trench having a second width that is greater than the first width of each of the first isolation trenches,
wherein the plurality of second transistors together form a second equivalent transistor.

18. The device of claim 17 wherein the first isolation trenches extend into the substrate from the surface to a first depth, the second isolation trench extends into the substrate from the first surface to a second depth, and the second depth is greater than the first depth.

19. The device of claim 17 wherein the first isolation trenches have a triangular cross-sectional shape, and the second isolation trench has an isosceles trapezoidal cross-sectional shape.

* * * * *